(12) United States Patent
Chiu et al.

(10) Patent No.: US 12,141,004 B2
(45) Date of Patent: Nov. 12, 2024

(54) FLEXIBLE AND ADAPTIVE INTERFACE BETWEEN ELECTRONICS AND IMMERSION COOLING SYSTEM

(71) Applicant: Google LLC, Mountain View, CA (US)

(72) Inventors: Jerry Chiu, Pacifica, CA (US); Evan Fraisse, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 189 days.

(21) Appl. No.: 17/532,416

(22) Filed: Nov. 22, 2021

(65) Prior Publication Data

US 2023/0161392 A1 May 25, 2023

(51) Int. Cl.
*H05K 7/20* (2006.01)
*G06F 1/20* (2006.01)
*H05K 7/18* (2006.01)

(52) U.S. Cl.
CPC ............. *G06F 1/20* (2013.01); *H05K 7/18* (2013.01); *H05K 7/203* (2013.01); *G06F 2200/201* (2013.01)

(58) Field of Classification Search
CPC ...... G06F 1/20; G06F 2200/201; G06F 1/181; G06F 1/184; G06F 1/185; G06F 1/189; G06F 1/26; H01L 23/44; H05K 7/20236; H05K 7/1424; H05K 7/203; H05K 7/18
USPC .................................................. 361/679.53
See application file for complete search history.

(56) References Cited

U.S. PATENT DOCUMENTS

| | | | |
|---|---|---|---|
| 9,223,360 B2 | 12/2015 | Attlesey | |
| 10,143,113 B2* | 11/2018 | Shelnutt | G06F 1/20 |
| 10,653,043 B2 | 5/2020 | Enright et al. | |
| 10,888,031 B2 | 1/2021 | Franz et al. | |
| 10,939,581 B1* | 3/2021 | Chen | H05K 7/20781 |
| 10,969,842 B2 | 4/2021 | Enright et al. | |
| 11,009,925 B2* | 5/2021 | Saito | H05K 7/20772 |
| 2014/0216686 A1 | 8/2014 | Shelnutt et al. | |
| 2014/0218858 A1* | 8/2014 | Shelnutt | H05K 7/203 |
| | | | 361/679.31 |
| 2015/0060009 A1* | 3/2015 | Shelnutt | H05K 7/20809 |
| | | | 165/11.1 |
| 2017/0295676 A1* | 10/2017 | Conn | H05K 7/20772 |

(Continued)

FOREIGN PATENT DOCUMENTS

| | | |
|---|---|---|
| CN | 111352490 A | 6/2020 |
| EP | 2704190 A1 | 3/2014 |
| WO | 2021080660 A1 | 4/2021 |

OTHER PUBLICATIONS

Extended European Search Report for European Patent Application No. 22188524.7 dated Mar. 30, 2023. 8 pages.

*Primary Examiner* — Mandeep S Buttar
(74) *Attorney, Agent, or Firm* — Lerner David LLP

(57) ABSTRACT

A cage for containing a liquid immersible computer hardware component includes a base portion and two elongate portions extending in a depth direction from the base portion. The elongate portions define a socket adjacent to the base portion in the depth direction and between the elongate portions in a lateral direction. The base portion defines a depth extension below the socket in the depth direction and the elongate portions define lateral extensions on either side of the socket. The cage also includes a power adaptor for conveying power from an intake at an outer edge of the cage to the component when the component is received in the socket.

14 Claims, 6 Drawing Sheets

(56) References Cited

U.S. PATENT DOCUMENTS

2023/0049108 A1* 2/2023 Gao .................. H05K 7/203
2023/0059446 A1* 2/2023 Gao .................. H05K 7/208

* cited by examiner

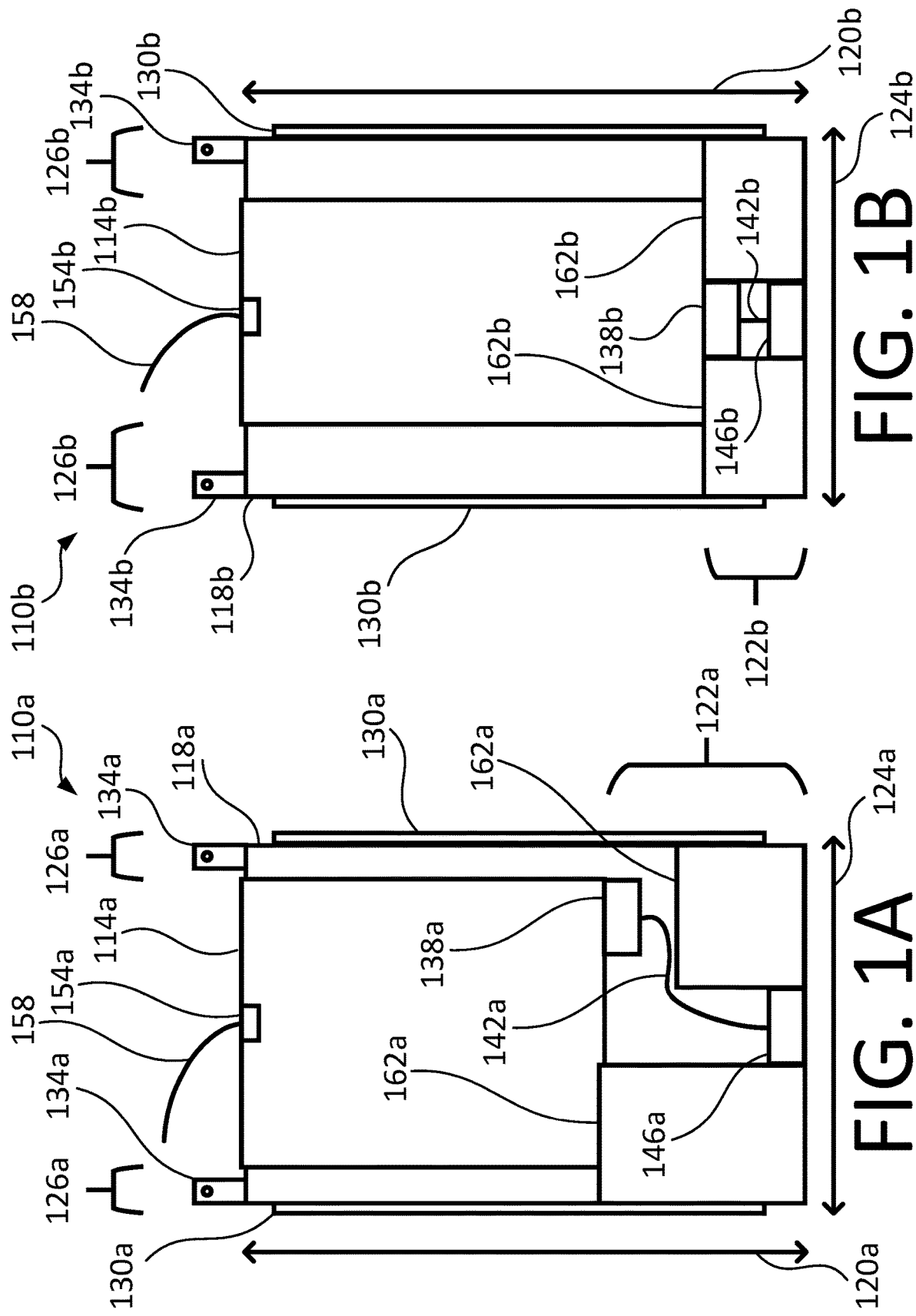

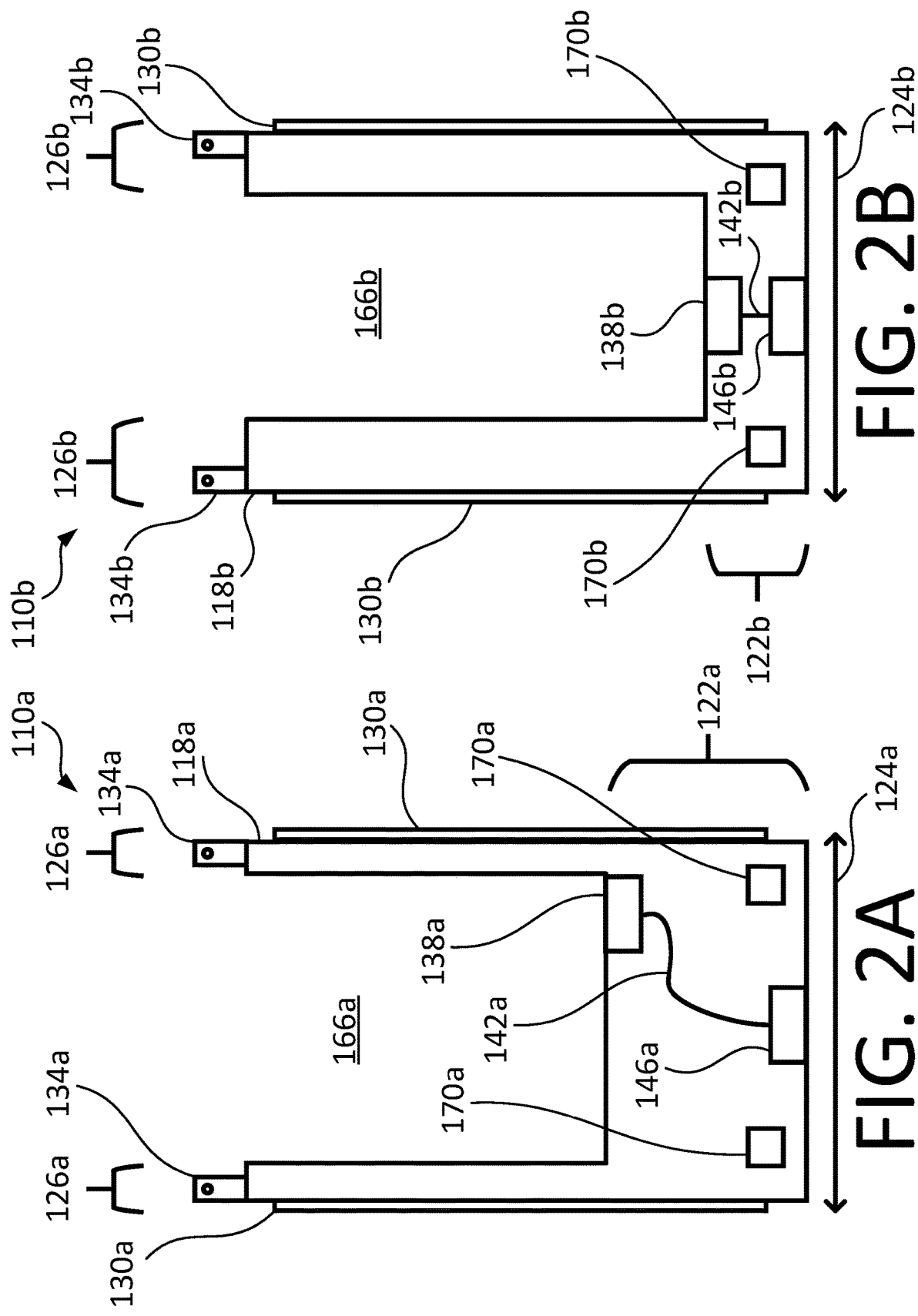

FLEXIBLE AND ADAPTIVE INTERFACE BETWEEN ELECTRONICS AND IMMERSION COOLING SYSTEM

BACKGROUND

Computing equipment generates heat during operation and tends to operate better and fail at lower rates when cooled. For this reason, cooling systems for computing equipment have been developed. One type of cooling system is an immersion cooling system having a tank of evaporable liquid and a condenser, the condenser typically being located above evaporable liquid, for extracting heat from and condensing vapor that rises from the tank. Immersion cooling systems may have a bus bar running along a bottom of the tank for supplying power to immersed hardware and electronic or data connections above the evaporable liquid. The data connections are provided with wires for connecting to the immersed hardware, but the immersed hardware components are typically connected to the bus bar by moving the component as a whole such that the component's power connection is placed in direct engagement with the bus bar. Immersion cooling is typically useful for computing equipment with particularly large cooling needs, such as computing equipment that generates a large amount of heat. Nonetheless, computing equipment that may be immersion cooled comes in a variety of shapes and sizes. Immersion tanks are therefore usually designed to accommodate the largest expected computer hardware components. This means tanks will have larger volumes than necessary for most combinations of computer hardware such that filling the tank will require more evaporable liquid that necessary for effective cooling. Smaller hardware may be entirely submerged in such tanks, making connecting the data wires to the hardware inconvenient. Smaller hardware may also be narrower than the tank, creating difficulty in aligning the hardware with the bus bar. Variability in the placement of power connections between hardware components may also contribute to difficulty in alignment.

BRIEF SUMMARY

Aspects of this disclosure are directed to cages that may be designed to receive or be constructed around hardware components of various shapes and sizes to make the hardware components simpler to align in a tank of an immersion cooling system. The cages may be designed to provide a common width together with the respective components for which the cages are designed. That is, the cages may be designed such that any cage, together with the component for which the cage is designed and with the component received in the cage in an intended position, will have a predefined lateral width, the predefined lateral width being the same for each combination of cage and intended component. The predefined lateral width may equal or be approximately the same as an internal lateral width of a tank in which the component is expected to be immersed such that the component cannot be laterally misaligned in the tank if the lateral direction of the component is matched to the lateral direction of the tank.

Cages may also each include a power adaptor to engage a bus bar in the tank and provide power to the respective received hardware component. The power adaptor may include a bus bar connection, a component connection, and an electrical connection, such as, for example, a wire, electrically connecting the bus bar connection and the component connection. The component connection may be located in the cage to engage the power connection of the cooled hardware component when the component is received in the cage in an intended position. The bus bar connection may be located in the cage to engage the bus bar when the cage and the component are placed in the tank in an intended position, such as, for example, a position wherein the lateral direction of the cage and component matches the lateral direction of the tank such that the cage and component are constrained from lateral motion within the tank. Thus, in combination with the above mentioned matching of the combined lateral width of the cage and the component to the internal lateral width of the tank, the power adaptor may enable the caged component to simply be dropped into the tank in the only lateral position that its total lateral width allows, and electrical connection of the component to the bus bar will be assured.

The cages may also be designed such that any cage, together with the component for which the cage is designed and with the component received in the cage in an intended position, may have a predefined height, the predefined height being the same for each combination of cage and intended component. The predefined height may be matched to an expected bus bar height and expected depth of liquid in the tank such that the connection point for the wired data connection on the component received in the cage will be at or near the surface of the evaporable liquid. Construction of the cage to place the connection point for the wired data connection on the component near the surface of the evaporable liquid may optimize both ease of access to the connection point and cooling efficiency.

In another aspect, a cage for containing a liquid immersible computer hardware component may comprise a base portion. The cage may also comprise two elongate portions extending in a depth direction from the base portion and defining a socket adjacent to the base portion in the depth direction and between the elongate portions in a lateral direction that is perpendicular to the depth direction such that the base portion defines a depth extension below the socket in the depth direction and the elongate portions define lateral extensions on either side of the size. The cage may also comprise a cage power intake located at an outer edge of the cage and configured for engagement with an electrical power supply. The cage may also comprise a component connection electrically connected to the cage power intake and positioned to engage a component power intake of the component when the component is retained within the socket.

In some arrangements according to any of the foregoing, the socket may be open on both sides in a longitudinal direction that is perpendicular to the depth direction and the lateral axis.

In some arrangements according to any of the foregoing, the cage may comprise at least one block extending beyond the lateral extensions in the longitudinal direction.

In some arrangements according to any of the foregoing, the lateral extensions may extend beyond the socket in the depth direction.

In some arrangements according to any of the foregoing, the socket may be open on a side opposite from the depth extension.

In some arrangements according to any of the foregoing, the socket may be configured to retain the component in a predefined position at which the component power intake engages the component connection of the cage.

In another aspect, an assembly may comprise a computer hardware component having a component power intake and capable of operating while immersed in liquid and a cage retaining the component in a fixed position relative to the cage. The cage may comprise a cage power intake configured for engagement with an electrical power supply, a component connection engaging the component power intake, an electrical connection between the power intake and the component connection, a depth extension extending in a depth direction from the component, the cage power intake being located at an edge of the depth extension opposite from the component, and lateral extensions extending along both lateral sides of the component. A lateral axis may be perpendicular to the depth direction.

In some arrangements according to any of the foregoing, the component connection and electrical connection may be located within the depth extension.

In some arrangements according to any of the foregoing, the cage may leave an edge of the component opposite from the depth extension exposed.

In some arrangements according to any of the foregoing, the lateral extensions may extend beyond an end of the component opposite from the depth extension.

In some arrangements according to any of the foregoing, the assembly may comprise at least one filler block having a longitudinal thickness greater than longitudinal thicknesses of the lateral extensions. A longitudinal direction may be perpendicular to the depth direction and a lateral axis.

In some arrangements according to any of the foregoing, the at least one filler block may be part of the depth extension.

In some arrangements according to any of the foregoing, the cage may leave longitudinal-facing sides of the component uncovered.

In some arrangements according to any of the foregoing, the cage may seal the computer hardware component such that the computer hardware component is capable of operating while immersed in liquid at a greater depth when retained in the socket than when the component is separated from the cage.

In another aspect, a method may comprise determining internal dimensions of a space for which computer hardware components of varying sizes are to be adapted. The method may also comprise determining at least two perpendicular dimensions of each component. The method may also comprise designing a cage for each component with reference to the dimensions of the space and the dimensions of the component having a socket within which the respective component may be retained in a fixed position to form an assembly of the cage and the component having a lateral width, the lateral width of each assembly of a cage and a respective component being equal. The method may also comprise fabricating the cages and assembling the cages to their respective components to form the assemblies.

In some arrangements according to any of the foregoing, the method may comprise constructing each cage to have a cage power intake at a same lateral location relative to the respective assembly as a whole and a component connection that is located to engage a power intake of the component when the component is retained in the fixed position, the cage power intake being electrically connected to the component connection in a manner enabling conveyance of power to the component through the cage power intake.

In some arrangements according to any of the foregoing, the method may comprise constructing the cages such that a distance in a depth direction between the power intake and a data connection point of the component for which the cage is designed when the component is retained in the intended position is equal for each assembly is equal for each assembly of one of the cages with the respective one of the components. The depth direction may be perpendicular to the lateral axis.

In some arrangements according to any of the foregoing, the method may comprise constructing each of the multiple cages to have an equal thickness at a thickest point of the cage, wherein a thickness direction is perpendicular to the lateral axis and a depth direction.

In some arrangements according to any of the foregoing, the method may comprise constructing each cage to have extensions that extend away from the power intake and beyond the data connection point when the component is retained in the intended position.

In some arrangements according to any of the foregoing, the method may comprise constructing each cage to have a depth extension extending in the depth direction beyond an edge of the component when the component is retained in the fixed position and containing the power intake and the component connection.

In some arrangements according to any of the foregoing, the method may comprise constructing the depth extension to include blocks on either side of the power intake, the blocks being the thickest part of the assembly in a longitudinal direction that is perpendicular to the lateral axis and the depth direction.

In some arrangements according to any of the foregoing, the method may comprise constructing filler blocks that are removably attachable to the cage and which extend in a longitudinal direction from the cage when attached to the cage, wherein the longitudinal direction is perpendicular to the lateral and the depth direction.

BRIEF DESCRIPTION OF THE DRAWINGS

FIG. 1A is a front elevation view of a cage and component assembly

FIG. 1B is a front elevation view of another cage and component assembly.

FIG. 2A is a front elevation view of a cage of the assembly of FIG. 1A.

FIG. 2B is a front elevation view of a cage of the assembly of FIG. 1B.

DETAILED DESCRIPTION

Figure 1C:
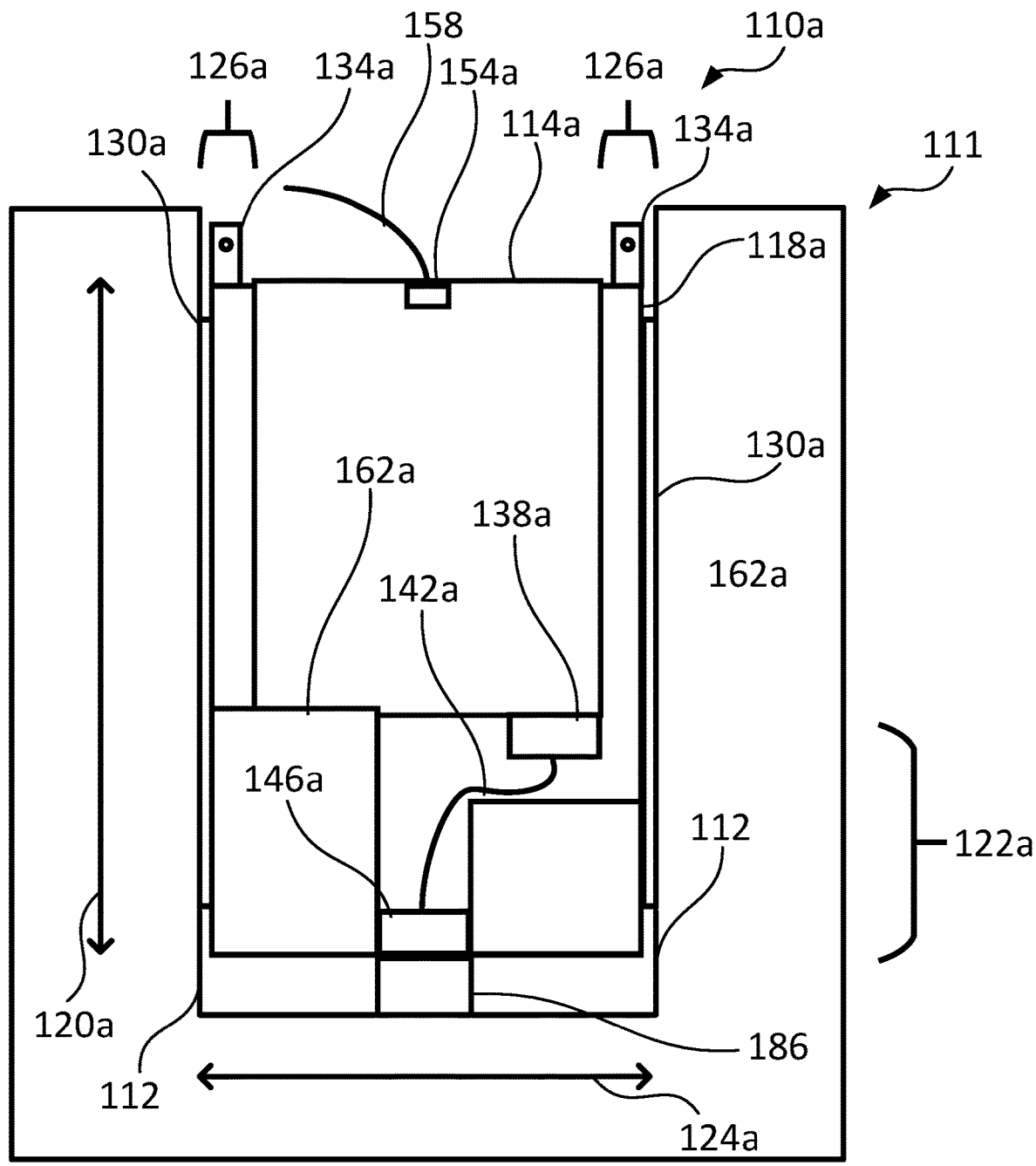
FIG. 1C is a front elevation view of the assembly of FIG. 1A received in a tank.

FIG. 1A illustrates a first assembly 110a including a hardware component 114a and a cage 118a that may be dropped into an evaporable liquid in an immersion cooling system. Component 114a may be any hardware device that can generate heat and benefit from immersion cooling, such as, for example, information technology equipment, computer hardware, or other electronic hardware. Cage 118a is designed and constructed to retain component 10a in a predetermined location and orientation relative to cage 118a as shown in FIG. 1A. Thus, first assembly 110a is the combination of component 114a and cage 118a with component 114a retained by cage 118a in the predetermined location and orientation relative to cage 118a. Cage 118a may be made of any material or combination of materials that is strong enough to hold and carry component 114a and compatible with the evaporable liquid used in the system for which first assembly 110a is intended. Some suitable examples include metals, such as, for example, aluminum or steel, rigid plastics, and certain ceramics.

Within first assembly 110a, cage 118a extends beyond component 114a in multiple dimensions. A base portion or depth extension 122a is a portion of cage 118a that extends beyond component 114a in a direction that is downward relative to an orientation in which first assembly 10a is intended to be immersed in a tank of evaporable liquid in an immersion cooling system. Depth extension 122a therefore extends down toward a bottom of the tank from a lower edge of component 114a when first assembly 110a is immersed in the tank in first assembly's 110a intended orientation. Upward relative to the intended orientation for immersion of first assembly 110a therefore corresponds to shallower locations within the liquid, while downward corresponds to deeper locations within the liquid.

Elongate portions or lateral extensions 126a are portions of cage 118a that extend laterally beyond either lateral side of component 114a, with the lateral axis being normal to the upward-downward or depth axis defined relative to first assembly 10a. In the illustrated example, lateral extensions 126a overlap with depth extension 122a and extend upward from depth extension 122a along the lateral edges of component 114a. In other examples lateral extensions 126a may be separate pieces from depth extension 122a or may be connected to depth extension 122a by structures that do not extend both laterally and below component 114a. The illustrated example of cage 118a extends laterally beyond component 114a in both directions in the illustrated example such that cage 118a includes two lateral extensions 126a, but in other examples cage 118a may include only one lateral extension. Regardless of whether cage 118a has one lateral extension 126a or two, a distance between two opposite lateral-most points first assembly 110a as provided by the combination of component 114a and cage 118a defines a first lateral width 124a.

Lateral extensions 126a each include a guide 130a and a lift point 134a. Guides 130a are laterally extending flanges for engagement with complementary track structures in a tank into which first assembly 110a may be immersed. Guides 130a may extend beyond other portions of lateral extensions 126a as shown to provide the lateral-most edges of their respective lateral extensions 126a. Lift points 134a extend above an upper edge of component 114a within first assembly 110a, meaning an upper edge of component 114a when component 114a is retained in the predetermined location and orientation in cage 118a. Lift points 134a may be any feature that can be grasped or engaged and pulled to lift first assembly 110a upward. Some examples of structures that may provide lift points 134a include flanges or tabs, which may have holes extending through them as shown in the illustrated example, hooks, or eye bolts. Though both lateral extensions 126a include guides 130a and lift points 134a in the illustrated example, other arrangements of cage 118a omit either or both of guides 130a and lift points 134a from either or both lateral extensions 126a.

Cage 118a also includes a power adaptor for component 114a. Cage's 118a power adaptor includes a component connection 138a, a cage power intake 146a, and one or more wires 142a electrically connecting component connection 138a to cage power intake 146a. Component connection 138a is located within cage 118a to engage a power intake feature of component 114a when component 114a is retained by cage 118a in the predetermined location and orientation to form first assembly 110a. The electrical connection provided by wire 142a is such that engagement of cage power intake 146a to a power source suitable for component 114a when component 114a and cage 118a are combined as first assembly 110a will power component 138a as if component's 138a power intake feature was itself engaged directly with the power source. Component 138a may therefore be powered by positioning first assembly 110a to engage cage power intake 146a to any power source that component's 114a own power intake feature is designed to connect to. The power adaptor overall, or at least component connection 138a and cage power intake 146a, may be included in a common extension of cage 118a, such as in the illustrated example wherein component connection 138a, wire 142a, and cage power intake 146a are all part of depth extension 122a because component's 114a power intake feature is located at a bottom end of component 114a. However, in other arrangements, depending on the location of component's 114a power intake feature and the direction in which first assembly 118a is intended to engage a power source, component connection 138a and cage power intake 146a may be part of different extensions of cage 118a.

Component 114a has a data connector 154a for electronic connection to other systems, such as the internet, computer networks, building management systems, or other information technology systems. Data cable 158a may be connected to data connector 154a to establish the electronic communication between component 114a and the other systems. A power-to-data height 120a of first assembly 110a is a vertical distance from first assembly's 110a bottom edge to the upper end of data connector 154a. First power-to-data height 120a in the illustrated example equals the vertical distance between the upper end of data connector 154a and the lower end of cage power intake 146a, though these distances may differ in other arrangements.

First assembly 110a may optionally include removable filler blocks 162a. Filler blocks 162a are attachable to a longitudinal face of cage 118a to increase a longitudinal thickness of assembly 110a, where the longitudinal axis is perpendicular to both the lateral axis and the up-down or depth axis. Filler blocks 162a act to occupy volume in the tank of the immersion cooling system for which first assembly 110a is intended. By occupying volume in the tank, filler blocks 162a decrease the total amount of liquid needed to fill the tank to an intended fill level. Filler blocks 162a may therefore reduce the inefficiencies associated with immersion cooling of relatively small components 114a, which may take up so little space in the tank that more liquid is needed to fill the tank than for effective cooling. Because filler blocks 162a are removable, filler blocks 162a of different sizes can be chosen and attached to cage 118a as necessary to optimize flow around component 114a and the amount of liquid displaced by first assembly 10a. Cage 118a may include longitudinal extensions, meaning portions that extend longitudinally beyond component 114a when component 114a and cage 118a are combined as first assembly 110a, other than removable filler blocks 162a, but such other longitudinal extensions are not shown in the illustrated example.

Construction of cage 118a to give assembly 110a an overall shape and size convenient for placement in a given immersion cooling tank reduces the need to consider the dimensions of the tank when designing component 114a itself. Use of cages such as cage 118a therefore decouples component design from tank dimensions.

Component 114a may be a type of hardware that is already configured for immersion cooling or a type of hardware that is typically cooled by air convection or with a cold plate. Where component 114a is a component that is typically air cooled, cage 118a may be configured to seal or otherwise waterproof component 114a when cage 118a and component 114a are combined as assembly 110a. Such sealing or waterproofing may encompass the entirety of component 114a such that component 114a can operate when entirely submerged in dielectric fluid or other liquid coolant. In other examples, sealing or waterproofing may exclude a top part of component 114a that includes data connector 154a so that component 114a may operate when assembly 110a is immersed in dielectric fluid or other liquid coolant as long as data connector 154a remains exposed above the liquid or is sealed by another element, such as a plug of data cable 158a.

FIG. 1B shows second assembly 110b, which is the same as first assembly 110a with respect to all above described details of and possible variations on first assembly 110a. Elements of second assembly 110b match like numbered elements of first assembly 110a. As such, second assembly 110b includes a cage 118b that retains a component 114b in an intended location and orientation in the same manner that cage 118a retains component 114a. Much like cage 118a, cage 118b also includes a depth extension 122b extending below component 114b and lateral extensions 126b extending upward from depth extension 122b along both lateral edges of component 114b, and depth extension 122b and lateral extensions 126b are generally similar to depth extension 122a and lateral extensions 126a, respectively. Guides 130b provide lateral-most edges of lateral extensions 126b and lift points 134b provide upper ends of lateral extensions 126b. Cage 118b includes a power adaptor provided by a cage power intake 146b that is electrically connected to a component connection 138b by a wire 142b, and component connection 138b is operatively engaged with a power intake feature of component 114b when component 114b and cage 118b are combined as second assembly. Component 114b includes a data connector 154b for electronically connecting component 154b to other systems. Removable filler blocks 162b are attachable to cage 118b to reduce the volume of liquid needed to fill a tank in which second assembly 114b is received. A second lateral width 124b is a distance between opposite lateral-most edges of second assembly 114b, and a second power-to-data height 120b is a vertical distance between an upper end of data connector 154b and a bottom edge of second assembly 114b. Second power-to-data height 120b also equals a vertical distance between the upper end of data connector 154b and a lower end of cage power intake 146b.

As FIGS. 1A and 1B show, second assembly 114b differs from first assembly 114a in that component 114b has different height and lateral width dimensions than component 114a, and cage 118d differs in construction from cage 118a to accommodate the dimensions of component 114b. However, first lateral width 124a is equal to second lateral width 124b, and first power-to-data height 120a is equal to second power-to-data height 120b. Moreover, the lateral position of second assembly's 114b cage power intake 146b along second lateral width 124b is the same as the lateral position of first assembly's 114a cage power intake 146a along first lateral width 124a despite the differing lateral locations of component connections 138a, 138b along their respective components 114a, 114b. Because of the matching power-to-data heights 120a, 120b, lateral widths 124a, 124b, and lateral locations of cage power intakes 146a, 146b, first assembly 110a and second assembly 110b have very similar form-factors and can both generally be connected to other devices and handled in the same manner as one another despite the differences in shape and size between components 114a, 114b. Application of cages 118a, 118b to components 114a, 114b therefore imposes uniformity on components 114a, 114b. Similar cages can be applied to any number of hardware components of varying shape and size to give all such various components equal lateral widths and power-to-data heights along with uniform placement of the cage power intakes relative to the components' data connections.

As shown in FIG. 1C, such uniformity in form factor across assemblies 110a, 110b for differing components 114a, 114b can have utility in immersion cooling systems. A tank 111 of FIG. 1C has laterally opposed internal sidewalls 112 spaced apart by a distance equal, or slightly larger than, first lateral width 124a. First assembly 110a, when oriented such that its lateral direction is aligned with the lateral direction between sidewalls 112, can be guided predictably into place by the close fit of lateral extensions 126a between sidewalls 112. The close and predictable fit of first assembly 110a into tank 111 reliably aligns cage power intake 146a with a bus bar 186 running along a bottom of tank 111 to power component 114a and support first assembly 110a. Liquid may be filled into tank 111 up to just below data connector 154a to place most of component 114a in contact with the liquid while leaving data connector 154a above the level of the liquid for ease of access. With liquid just below data connector 154a, lift points 134a extend even further above the liquid for easy connection and lifting.

Because first and second lateral widths 124a, 124b are equal to each other, second assembly 110b could be aligned and dropped between sidewalls 112 just as easily as first assembly 110a. Because second assembly's 110b cage power intake 146b has the same lateral location relative to second assembly 110b as a whole as first assembly's 110a cage power intake has relative to first assembly 110a as a whole, second assembly's 110b cage power intake 146b would also align to and engage bus bar 186. Because first and second power-to-data heights 120a, 120b are equal to each other, the optimum liquid level in tank 111 for submerging most of first assembly's 110a component 114a while leaving data connector 154a above the liquid level would also submerge most of second assembly's 110b component 114b while leaving data connector 154b above the liquid level. Second assembly's 110b lift points 134b will also extend above data connector 154b and the liquid level. This same ease and uniformity of alignment can be achieved for as many hardware components may be fitted with similar cages.

FIG. 2A illustrates cage 118a alone. A socket 166a for receiving component 114a is a space defined laterally between lateral extensions 126a and vertically above depth extension 122a. Cage 118a also includes filler connectors 170b at which filler blocks 162a may be connected. Two filler connectors 170a are shown, but in other examples, cage 118a may have no filler connectors 170a, one filler connector 170a, or any plural number of filler connectors 170a. Filler connectors 170a, 170b may be, for example, snap fit connections, hook and loop connections, magnets, buckles, straps, or any other feature by which filler block 162a, 162b could be connected to a corresponding cage 118a, 118b.

As shown in FIG. 2B, cage 118b similarly has filler connectors 170b, which may exist in any quantity. Cage 118b also defines a socket 166b laterally between lateral extensions 126b and vertically above depth extension 122b for receiving component 114b. Socket 166b has different dimensions from socket 166a in the same way that component 114b has different dimensions from component 114a.

Figure 3:
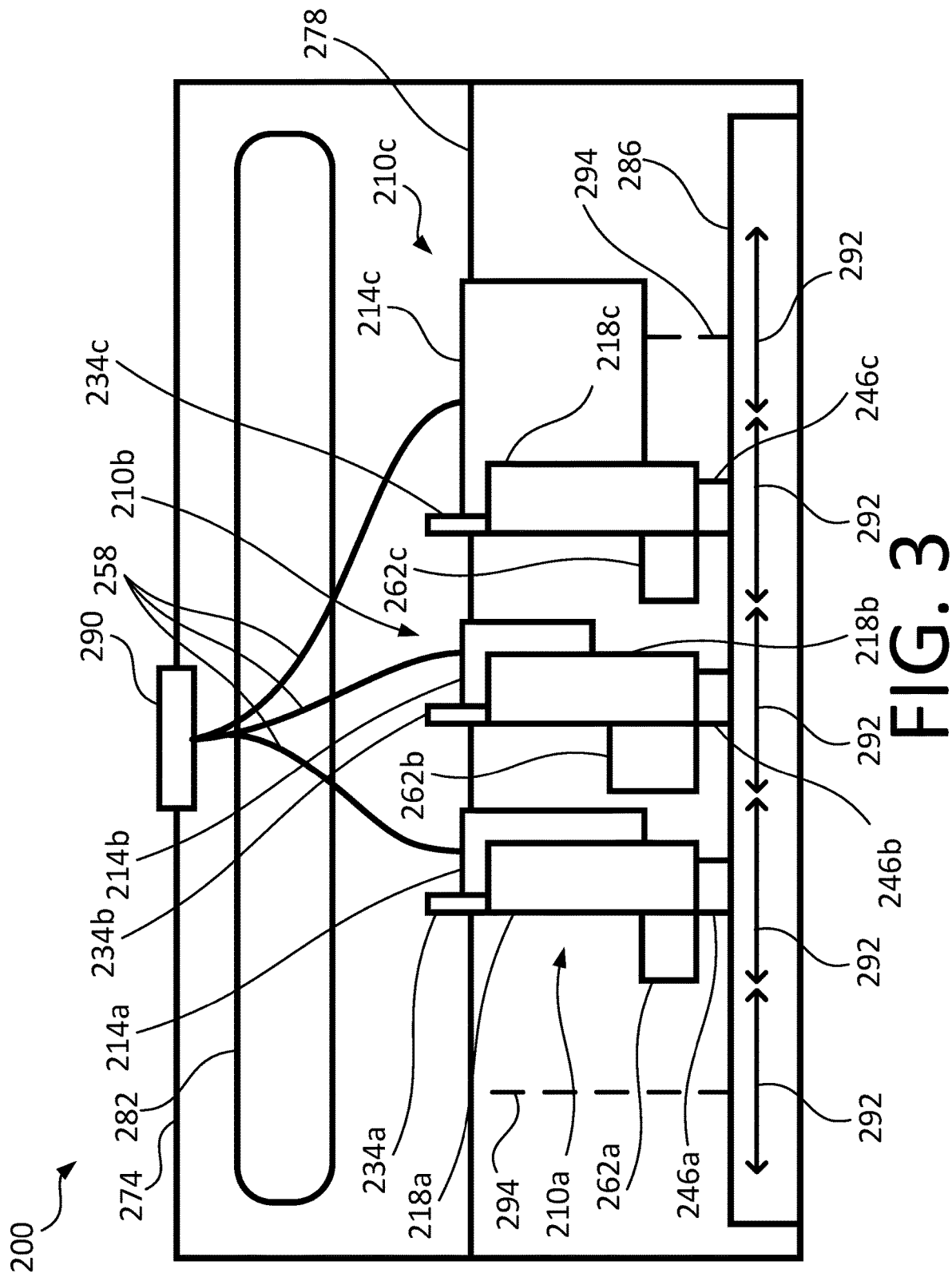
FIG. 3 is a side elevation cross-section of an immersion cooling system for use with cage and component assemblies.

FIG. 3 illustrates a two phase immersion cooling system 200 in which a first assembly 210a, second assembly 210b, and third assembly 210c are immersed in evaporable liquid 278 in a tank or enclosure 200. Three assemblies 210a, 210b, 210c are shown by way of example, but one, two, four, or more such assemblies having hardware components of varying sizes could be used in system 200. Examples of suitable evaporable liquids 278 include any of several commercially available dielectric fluids engineered specifically for immersion cooling of computer hardware, though water may be used in some applications if electrical conductivity of the evaporable fluid is not a concern.

Assemblies 210a, 210b, 210c are generally alike to first assembly 110a and second assembly 110b with respect to all above described details of and possible variations on assemblies 110a, 110b. Elements of assemblies 210a, 210b, and 210c are generally alike to like numbered elements of assemblies 110a, 110b. As such, each assembly 210a, 210b, 210c includes a respective heat generating component 214a, 214b, 214c, cage 218a, 218b, 218c, lift point 234a, 234b, 234c, cage power intake 246a, 246b, 246c, and removable filler block 262a, 262b, 262c.

Assemblies 210a, 210b, 210c and liquid 278 are beneath a condenser 282. Condenser 282 may be a heat exchanger operating on a refrigerant cycle or supplied with an external source of coolant for cooling exposed elements upon which vapor in enclosure 274 may collect before dripping back into liquid 278 at the bottom of enclosure 274. Assemblies 210a, 210b, 210c are each supported upon a bus bar 286 running longitudinally along a bottom of enclosure 274. Each cage power intake 246a, 246b, 246c is engaged with bus bar 286 to receive power therefrom. As assemblies 210a, 210b, 210c run on power from bus bar 286, assemblies 210a, 210b, 210c generate heat that is dissipated into liquid 278. The heat causes liquid 278 to evaporate and rise into contact with condenser 282 before condensing and falling again.

Because, as shown, each assembly 210a, 210b, 210c has an equal height from the bottom of cage power intake 246a, 246b, 246c to an upper edge of component 214a, 214b, 214c, an upper edge of each component 214a, 214b, 214c is at or slightly above the level of liquid 278. As such, data connections at the top of each component 214a, 214b, 214c are above the level of liquid 278 and available for easy access for connection and disconnection of data cables 258 that extend from an access point 290 for other systems, such as the internet, building management, computer networks, or other information technology networks. Lift points 234a, 234b, 234c extend above data connectors 234a, 234b, 234c and even further above the level of liquid 278 for ease of access.

Like tank 111, enclosure 274 has laterally opposed internal sidewalls spaced apart from a distance equal to, or only slightly exceeding, the mutually equal lateral widths of assemblies 210a, 210b, 210c. The perspective of FIG. 3 is along the lateral direction, so only one internal sidewall having vertically extending tracks 294 is visible in FIG. 3. The other, not-illustrated sidewall may also have tracks matching and opposing visible tracks 294. Tracks 294 are complementary to guides on either lateral side of assemblies 210a, 210b, 210c that are generally alike to guides 130a, 130b of assemblies 110a, 110b discussed above. Thus, in addition to aligning assemblies 210a, 210b, 210c laterally with a close lateral fit, enclosure 274 also aligns assemblies 210a, 210b, 210c longitudinally by cooperation with each assembly's 210a, 210b, 210c guides with an opposed pair of sidewall tracks 294. Tracks 294 behind cages 218a, 218b, 218c are therefore hidden from view in FIG. 3.

The opposed pairs of tracks 294 are spaced apart by uniform longitudinal units 292. Assemblies 210a, 210b, 210c may therefore be reliably spaced apart by cooperation of the guides with tracks 294. Unusually large components, such as component 214c, may be granted two or more such longitudinal units 292 instead of one. Because the opposed pairs of tracks 294 are evenly spaced apart, assemblies 210a, 210b, 210c can be distributed in an orderly manner along enclosure 274 despite variations in size between components 214a, 214b, 214c. The length of enclosure 274, number of longitudinal units 292 within enclosure 274, number of tracks 294, and number of assemblies 210a, 210b, 210c shown in FIG. 2 are all merely examples, any one or any combination of which may be varied to suit a given application.

Figure 4:
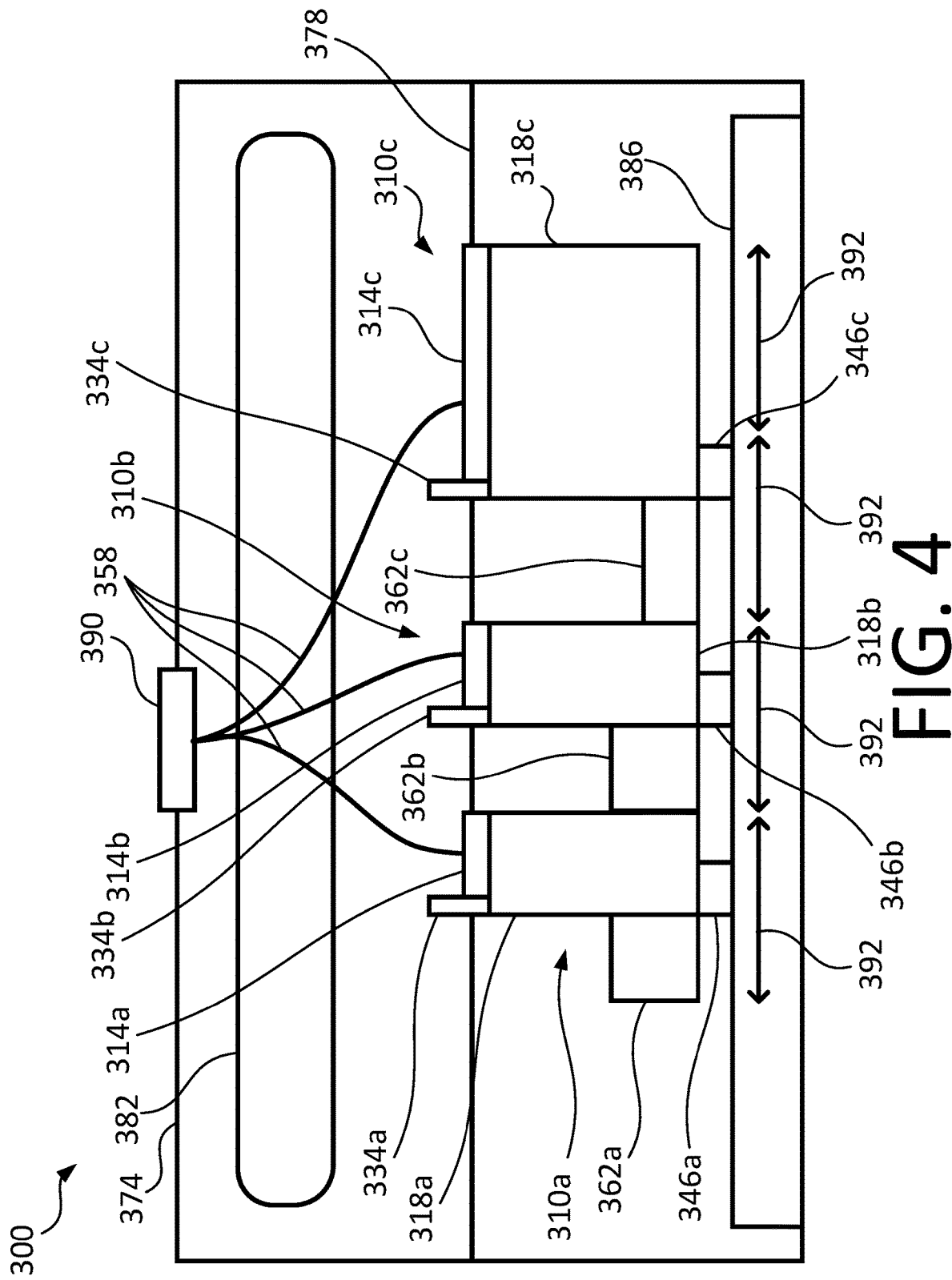
FIG. 4 is a side elevation cross-section of another immersion cooling system for use with cage and component assemblies.

FIG. 4 illustrates a two phase immersion cooling system 300 that is generally similar to system 200 except for specifically described or illustrated differences. Features of system 300 are generally alike to like numbered features of system 200 unless otherwise noted. As such, assemblies 310a, 310b, 310c are generally alike to assemblies 110a, 110b, 210a, 210b, 210c with respect to all above described details of and possible variations on assemblies 110a, 110b, 210a, 210b, 210c. Each assembly 310a, 310b, 310c includes a respective heat generating component 314a, 314b, 314c, cage 318a, 318b, 318c, lift point 334a, 334b, 334c, cage power intake 346a, 346b, 346c, and removable filler block 362a, 362b, 362c. Three assemblies 310a, 310b, 310c are shown by way of example, but one, two, four, or more such assemblies having hardware components of varying sizes could be used in system 300. Assemblies 310a, 310b, 310c are mostly submerged in liquid 378 and supported and powered by a bus bar 386 that runs longitudinally along a bottom of enclosure 374 under the surface of evaporable liquid 378. A condenser 382 above liquid 378 condenses vapors in enclosure 374 back to liquid that drips into liquid 378 at the bottom of enclosure 374. Each component 314a, 314b, 314c is electronically connected by a data cable 358 to an access point 390. The length of enclosure 374, number of longitudinal units 392 within enclosure 374, and number of assemblies 310a, 310b, 310c shown in FIG. 3 are all merely examples, any one or any combination of which may be varied to suit a given application.

System 300 differs from system 200 by the absence of tracks 294. Instead, each assembly 310a, 310b, 310c has a longitudinal thickness divisible into longitudinal units 392 achieved by varying the longitudinal dimensions of filler blocks 362a, 362b, 362c and cages 318a, 318b, 318c to be complementary to the differing thicknesses of components 314a, 314b, 314c. Assemblies 310a, 310b differ in shape and proportion from one another, but both have an equal longitudinal thickness of one longitudinal unit 392. Component 314c has a thickness exceeding one longitudinal unit 392, so filler block 362c is sized to bring a total longitudinal thickness of assembly 310c to exactly two longitudinal units 392. Assemblies can therefore be predictably spaced apart from one another in the longitudinal direction, despite the absence of tracks 294, by placing each assembly 310a, 310b, 310c into longitudinal abutment with its neighbors as shown. In the illustrated example, assemblies 310a, 310b, 310c are placed such that the filler blocks 362b, 362c abut cages 318a, 318b, respectively, but the portion of any assembly 310a, 310b, 310c that would abut its neighbor can vary depending on the shape and design of assemblies 310a, 310b, 310c according to arrangements other than the illustrated example.

As demonstrated in the foregoing examples, cages and assemblies according to the arrangements illustrated in FIGS. 1A-4 and described above can create uniform net shapes for electronic components of varying shapes and sizes. As such, after a variety of electronic components of differing shapes and sizes have been caged and thereby converted to assemblies according to the foregoing examples, those varying components can be handled in a similar manner to one another. Moreover, where the cages match the lateral dimensions of an immersion cooling tank, the varying components can each be quickly and simply dropped into the tank while the cages interact with the interior of the tank to align the components properly. The presence of the cages and the filler blocks in the tank will also reduce the amount of liquid needed to fill the tank when the components are in the tank.

Figure 5:
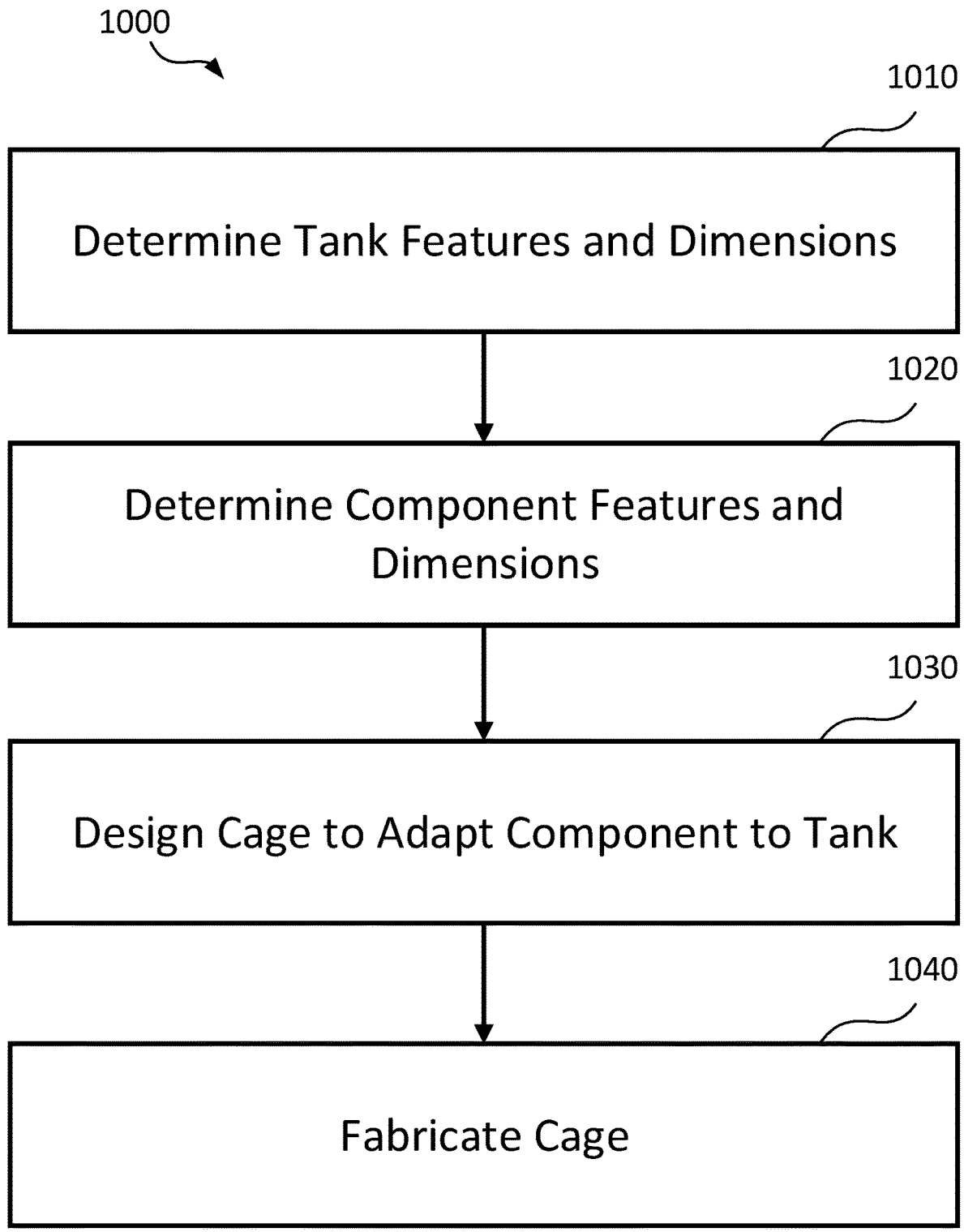
FIG. 5 is a flowchart of a process for normalizing computer hardware components of various sizes.

FIG. 5 illustrates a process 1000 for normalizing computer hardware components 114a, 114b, 214a, 214b, 214c, 314a, 314b, 314c of varying proportions, shapes, and sizes for use with a given immersion cooling tank. For the purposes of describing process, any components 114a, 114b, 214a, 214b, 214c will be referred to as component 114, any cages 118a, 118b, 218a, 218b, 218c, 318a, 314b, 314c will be referred to as cage 118, and so on for other numbered and lettered elements.

A tank assessment 1010 includes determining the dimensions and features of an immersion cooling tank for which components 114 are to be normalized. A lateral dimension of an interior of the tank is found for use as a basis for the lateral width 124 of assemblies 110 to be immersed in the tank. A depth of the tank may be found for use as a basis for a power-to-data height 120 of assemblies 110, and a longitudinal length of the tank may be found for use as a basis for a thickness of assemblies 110 and for determining a number of assemblies 110 that may be concurrently immersed in the tank. Determining the features of the tank may include determining whether the tank includes tracks 294. Determining the features of the tank may also include locating a bus bar 286 within the tank and determining the size of bus bar 286 for use as a basis for lateral placement of cage power intakes 146 and for use as an additional factor in determining the power-to-data height 120 of assemblies 110.

Tank assessment 1010 may be conducted on any actual tank or on a hypothetical tank. Thus, designs for cages 114 created at later steps can normalize components 114 for use with a particular tank that already exists or for a tank that has not yet been constructed. Cages 118 and tanks can therefore be designed together. In other examples, tank assessment step 1010 can simply be creation of dimensional targets to which cages 118 and assemblies 110 are to conform without reference to any actual or hypothetical tank designs.

Component assessment 1020 includes determining the relevant dimensions and features of a component 114 to be normalized. Component assessment 1020 may be performed several times for each tank assessment 1010 according to a number of types of components 114 to be normalized. Relevant dimensions can include component's 114 width, height, and thickness. Relevant features found during component assessment 1020 can include the location of component's 114 power intake, the placement of data connector 154 relative to component's 114 power intake, and whether or not component 114 is capable on its own of operating while immersed in dielectric fluid or another intended liquid coolant.

Design 1030 includes designing a cage 118 according to the information found in tank assessment step 1010 and component assessment step 1020. Design 1030 can be performed after each execution of component assessment step 1020, so, like component assessment step 1020, design 1030 can be performed several times for a single occurrence of tank assessment step 1010. In design 1030, a width of lateral extensions 126 is derived from a difference between the width of the component 114 and the internal lateral width of the tank, and a height of depth extension 122 may be derived from a difference between the intended fill-depth of the tank and the sum of power-to-data height 120 and the height of bus bar 286. Socket 166 is given a shape and size for securely retaining component 114 in an intended position. Cage power intake 146 is placed to match the lateral location of bus bar 286 within the tank and component connection 138 is placed relative to socket 166 to match the location of component's 114 power intake. Guides 130 may be added to lateral extensions 126 if the tank has tracks 294 and guides 130 may be omitted if the tank does not have tracks 294.

Fabrication 1040 includes creation of cage 118. Fabrication step 1040 is performed for each individual component 114 to be converted to an assembly 110. Fabrication 1040 may therefore be performed several times for each occurrence of component assessment 1020 and design 1030. Cage 118 can be created manually or by an automated manufacturing process. Fabrication 1040 may optionally also include either the placement of component 114 into cage's 118 socket 166 to form assembly 110 or construction of cage 118 around component 114 to form assembly 110.

Because every design 1030 performed with the results of a common tank assessment 1010 includes designing a respective cage 118 that adapts a respective component 114 to a common set of parameters derived from tank assessment step 1010, assemblies 110 resulting from fabricating 1040 will all have certain common dimensions and features, such as a common lateral width 124 and a common lateral location of cage power intake 146 along lateral width 124. Assemblies 110 may also have common heights and thicknesses. Because components 114 may differ from one another in any aspect that assemblies 110 share in common, process 1000 normalizes components 114 of various shapes and sizes with regard to whatever features are common among assemblies 110. For example, if multiple components 114 have differing widths while each assembly 110 has an equal longitudinal width 120, process 1000 has normalized components 114 with respect to lateral width 120.

Multiple variations from the illustrated example of process 1000 are possible. For example, though component assessment step 1020 is shown after cage assessment 1010, component assessment 1020 can be performed before or during cage assessment 1010. Instead of or in addition to the illustrated example of performing tank assessment 1010 first, a tank can be designed to accept to cage designs created in designing 1030.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A cage for containing a liquid immersible computer hardware component, the cage comprising:

a base portion;

two elongate portions extending in a depth direction from the base portion and defining a socket adjacent to the base portion in the depth direction and between the elongate portions in a lateral direction that is perpendicular to the depth direction such that the base portion defines a depth extension below the socket in the depth direction and the elongate portions define lateral extensions on either lateral side of the socket, each of the lateral extensions comprising a guide and a lift point;

a cage power intake located at an outer edge of the cage and configured for engagement with an electrical power supply;

a component connection electrically connected to the cage power intake and positioned to engage a component power intake of the component when the component is retained within the socket.

2. The cage of claim 1, wherein the socket is open on both sides in a longitudinal direction that is perpendicular to the depth direction and the lateral axis.

3. The cage of claim 1, comprising at least one block extending beyond the lateral extensions in the longitudinal direction.

4. The cage of claim 1, wherein the lateral extensions extend beyond the socket in the depth direction.

5. The cage of claim 1, wherein the socket is open on a side opposite from the depth extension.

6. The cage of claim 1, wherein the socket is configured to retain the component in a predefined position at which the component power intake engages the component connection of the cage.

7. An assembly comprising:
a computer hardware component having a component power intake and capable of operating while immersed in liquid; and
a cage retaining the component in a fixed position relative to the cage, the cage comprising:
a cage power intake configured for engagement with an electrical power supply;
a component connection engaging the component power intake;
an electrical connection between the power intake and the component connection;
a depth extension extending in a depth direction from the component, the cage power intake being located at an edge of the depth extension opposite from the component; and
lateral extensions extending along both lateral sides of the component, wherein a lateral axis is perpendicular to the depth direction, each of the lateral extensions comprising a guide and a lift point, the guides configured to engage complementary track structures in a tank.

8. The assembly of claim 7, wherein the component connection and electrical connection are located within the depth extension.

9. The assembly of claim 7, wherein the cage leaves an edge of the component opposite from the depth extension exposed.

10. The assembly of claim 7, wherein the lateral extensions extend beyond an end of the component opposite from the depth extension.

11. The assembly of claim 7, comprising at least one filler block having a longitudinal thickness greater than longitudinal thicknesses of the lateral extensions, wherein a longitudinal direction is perpendicular to the depth direction and a lateral axis.

12. The assembly of claim 11, wherein the at least one filler block is part of the depth extension.

13. The assembly of claim 11, wherein the cage leaves longitudinal-facing sides of the component uncovered.

14. The assembly of claim 7, wherein the cage seals the computer hardware component such that the computer hardware component is capable of operating while immersed in liquid at a greater depth when retained in the socket than when the component is separated from the cage.

\* \* \* \* \*